(12) United States Patent
Lou

(10) Patent No.: US 6,376,326 B1
(45) Date of Patent: Apr. 23, 2002

(54) METHOD OF MANUFACTURING DRAM CAPACITOR

(75) Inventor: Chine-Gie Lou, Hsinchu Hsien (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 48 days.

(21) Appl. No.: 09/675,440

(22) Filed: Sep. 28, 2000

(51) Int. Cl.$^7$ ................................. H01L 21/76
(52) U.S. Cl. ................. 438/396; 438/397; 438/393; 438/254; 438/253
(58) Field of Search ..................... 438/396, 397, 438/398, 399, 254, 255, 253

(56) References Cited

U.S. PATENT DOCUMENTS 6,054,394 A * 4/2000 Wang .......................... 438/753

\* cited by examiner

Primary Examiner—Matthew Smith
Assistant Examiner—David C Finsmith
(74) Attorney, Agent, or Firm—J.C. Patents

(57) ABSTRACT

A method of manufacturing a dynamic random access memory capacitor. To form the lower electrode of the capacitor involves using two different materials each having a different etching rate to form an alternately laid stack above a substrate. Differences in etching rates between the two materials are utilized to etch out a capacitor opening having serrated sidewalls. A polysilicon layer is next deposited into the capacitor opening. An aluminum layer and a titanium layer are sequentially formed over the polysilicon layer. An annealing operation is carried out in a nitrogen-filled atmosphere so that aluminum displaces polysilicon inside the capacitor opening. The silicon atoms in the polysilicon layer reacts with titanium atoms in the titanium layer to form a titanium silicide layer over the aluminum layer. The aluminum layer and the titanium silicide layer that cover the stacked layer are removed. The stacked layer is also removed to expose a fin-shaped aluminum lower electrode.

26 Claims, 5 Drawing Sheets

METHOD OF MANUFACTURING DRAM CAPACITOR

BACKGROUND OF THE INVENTION

1. Field of Invention

The present invention relates to a method of manufacturing the capacitors of a semiconductor memory. More particularly, the present invention relates to a method of manufacturing the metal-insulator-metal (MIM) capacitors of dynamic random access memory (DRAM).

2. Description of Related Art

The cell of a semiconductor memory such as a dynamic random access memory (DRAM) generally consists of a transistor and a capacitor. Therefore, performance of memory can be improved if fast-acting transistors and/or high capacity capacitors are manufactured.

As semiconductor manufacturers start manufacturing deep sub-micron devices, dimensions of each device also shrink leading to a smaller space for forming memory capacitor. On the other hand, the demand for more powerful software has increased the memory requirement in a computer. Hence, higher capacity memory unit is always in great demand. Such conflicting goals mean that basic changes to method of fabrication have to be introduced.

At present, methods capable of increasing memory capacity despite size reduction include increasing the surface area of capacitor's lower electrode and/or using a high dielectric constant (high-k) material. Typical stacked capacitor uses polysilicon as a storage node. High-k material includes barium-strontium-titanate ($BaSrTiO_3$, BST), whose dielectric constant can be up to a hundred or more.

Because electrical conductivity of a polysilicon storage node is conferred through dopant implant, depletion region is easily formed in the capacitor while the memory is in operation. This can lead to a serial connection of the capacitors and result in a lowering of DRAM storage capacitance. Furthermore, polysilicon and barium-strontium-titanate often react at their interface. Consequently, when BST is used in a stacked capacitor, the conventional electrode material must be replaced to boost performance.

The so-called metal-insulator-metal structure of a capacitor is a capacitor that uses metal to form the upper and the lower electrodes. Since metal has a relatively low resistance and little interfacial reaction, MIM structure is capable of increasing capacitor performance.

However, the metal lower electrode of a MIM capacitor is preferably shaped into a crown or a fin to increase surface area and hence capacitance of the capacitor. Yet, shaping the metal electrode using existing fabricating techniques is still quite difficult.

SUMMARY OF THE INVENTION

Accordingly, one object of the present invention is to provide a method of manufacturing a metal-insulator-metal capacitor structure capable of increasing capacitor performance.

Another object of the invention is to provide a metal-insulator-metal capacitor structure capable of increasing storage electrode surface area and hence storage capacitance.

To achieve these and other advantages and in accordance with the purpose of the invention, as embodied and broadly described herein, the invention provides a method of manufacturing a DRAM capacitor. To form the lower electrode of the capacitor involves using two different materials each having a different etching rate to form an alternately laid stack above a substrate. Differences in etching rates between the two materials are utilized to etch out a capacitor opening having serrated sidewalls. A polysilicon layer is next deposited into the capacitor opening. An aluminum layer and a titanium layer are sequentially formed over the polysilicon layer. An annealing operation is carried out in a nitrogen-filled atmosphere so that aluminum displaces polysilicon inside the capacitor opening. The silicon atoms in the polysilicon layer reacts with titanium atoms in the titanium layer to form a titanium silicide layer over the aluminum layer. The aluminum layer and the titanium silicide layer that cover the stacked layer are removed. The stacked layer is also removed to expose a fin-shaped aluminum lower electrode.

Since aluminum instead of polysilicon is used to fabricate the lower electrode, problems caused by the formation of a capacitor depletion region can be prevented. Furthermore, in the fabrication of the aluminum lower electrode, polysilicon, which has good step coverage, is deposited into the mold inside the stacked layer first. In the subsequent step, the polysilicon layer inside the mold is replaced by the aluminum layer deposited over the polysilicon layer in a polysilicon-aluminum displacement process. Consequently, the aluminum lower electrode thus formed also has good step coverage.

The stacked layer is made from two different insulating materials that has different etching rates. Hence, a capacitor opening with serrated sidewalls can easily be formed in the stacked layer by etching. Utilizing the mold cavity with serrated sidewalls, a fin-shaped aluminum lower electrode that can increase overall surface area of the lower electrode is formed with ease.

In addition, the aluminum lower electrode is formed by displacing polysilicon instead of depositing directly into the mold cavity in the stacked layer. Therefore, aluminum is first deposited over the polysilicon layer by physical vapor deposition. Later, the aluminum layer displaces the underlying polysilicon layer. Because the aluminum lower electrode is formed by displacement, step coverage problems encountered by a conventional metal deposition process can be avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
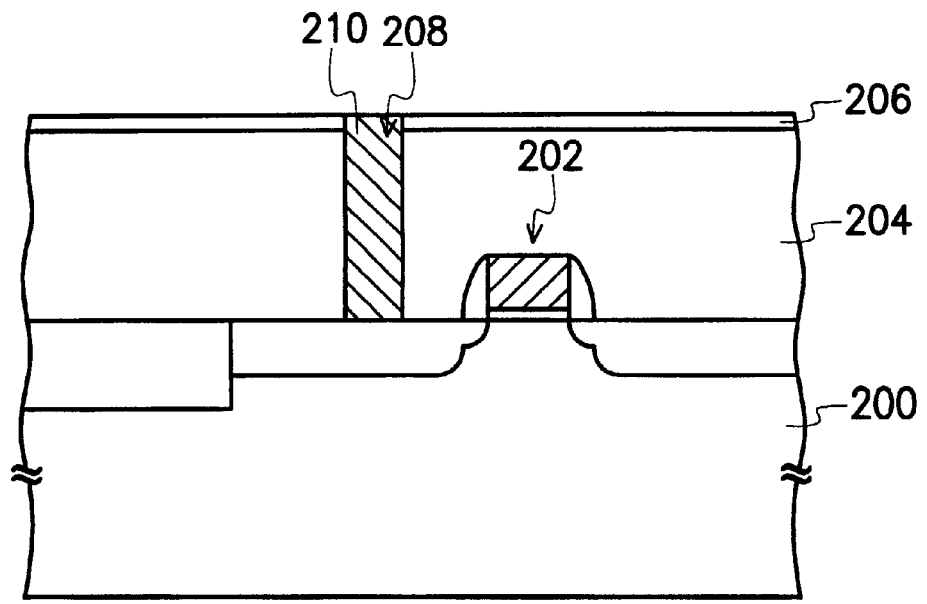
FIGS. 1A through 1I are schematic cross-sectional views showing the progression of steps for producing a DRAM capacitor according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1I are schematic cross-sectional views showing the progression of steps for producing a DRAM capacitor according to one preferred embodiment of this invention.

As shown in FIG. 1A, a dielectric layer 204 and an etching stop layer 206 are sequentially formed over a substrate 200 having a transistor 202 thereon. The dielectric layer 204 can be a silicon oxide layer and serves as an inter-layer dielectric. The dielectric layer 204 is formed, for example, by chemical vapor deposition. The etching stop layer 206 serves as a protective layer for the dielectric layer 204 in a subsequent etching operation. The etching stop layer 206 can be a silicon nitride layer formed, for example, by chemical vapor deposition.

Photolithographic and etching techniques are used to pattern the dielectric layer 204 and the etching stop layer 206 to form a contact opening 208. A contact plug 210 is formed inside the contact opening 208. The contact plug 210 can be formed, for example, by depositing a conductive material over the etching stop layer 206 and filling the contact opening 208 to form a conductive layer. A reactive ion etching operation is next carried out to remove the conductive layer that covers the etching stop layer 206. Conductive material for forming the contact plug 210 includes doped polysilicon having a dopant concentration of about 5E19 phosphorus (P) atoms/cm$^3$.

Figure 1B:
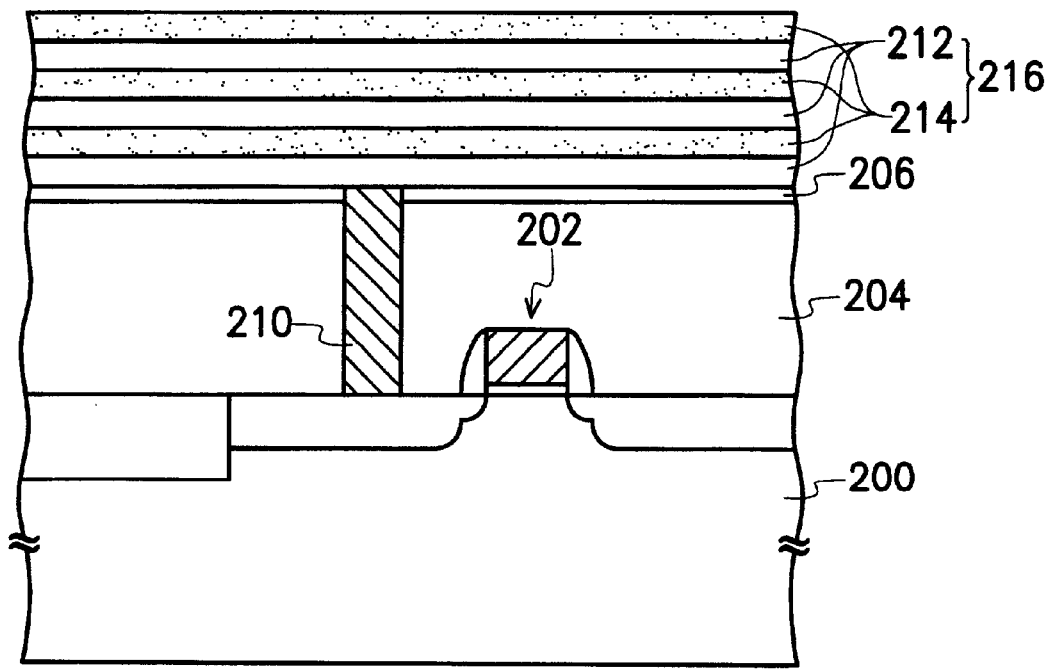

As shown in FIG. 1B, a stacked layer 216 comprising of two alternating material layers 212 and 214 is formed over the substrate 200. The material layers 212 and 214 are made from different materials and hence each has a different etching rate. The material layers 212 are borophosphosilicate glass layers, the material layers 214 are high temperature oxide layers, for example.

Figure 1C:
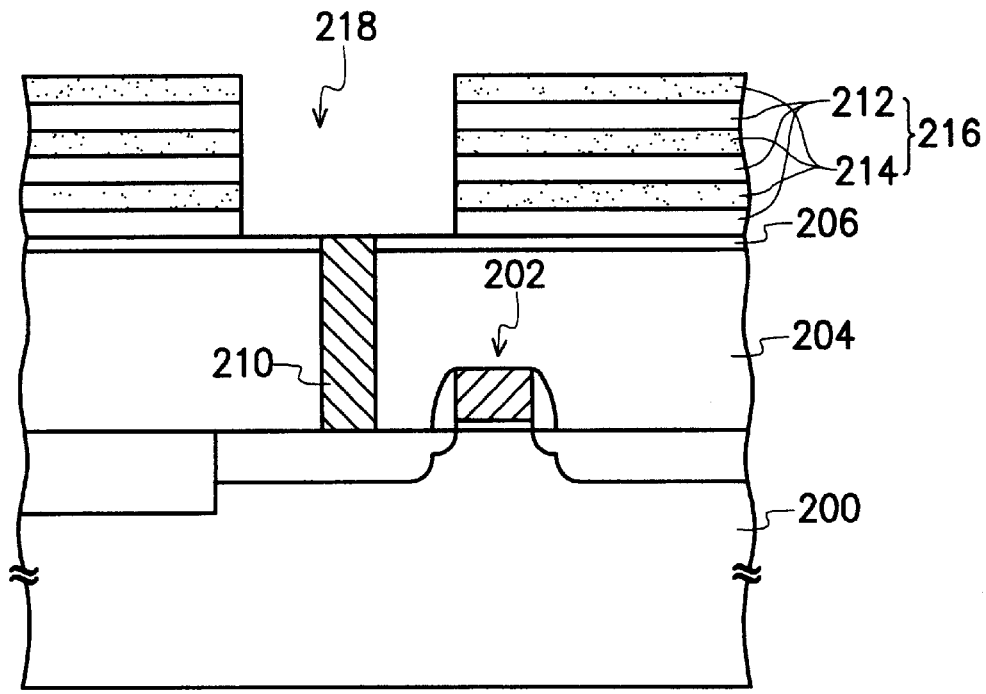

As shown in FIG. 1C, photolithographic and dry etching techniques are used to pattern the stacked layer 216 so that a capacitor opening 218 that exposes the contact plug 210 and a portion of the etching stop layer 206 is formed.

Figure 1D:
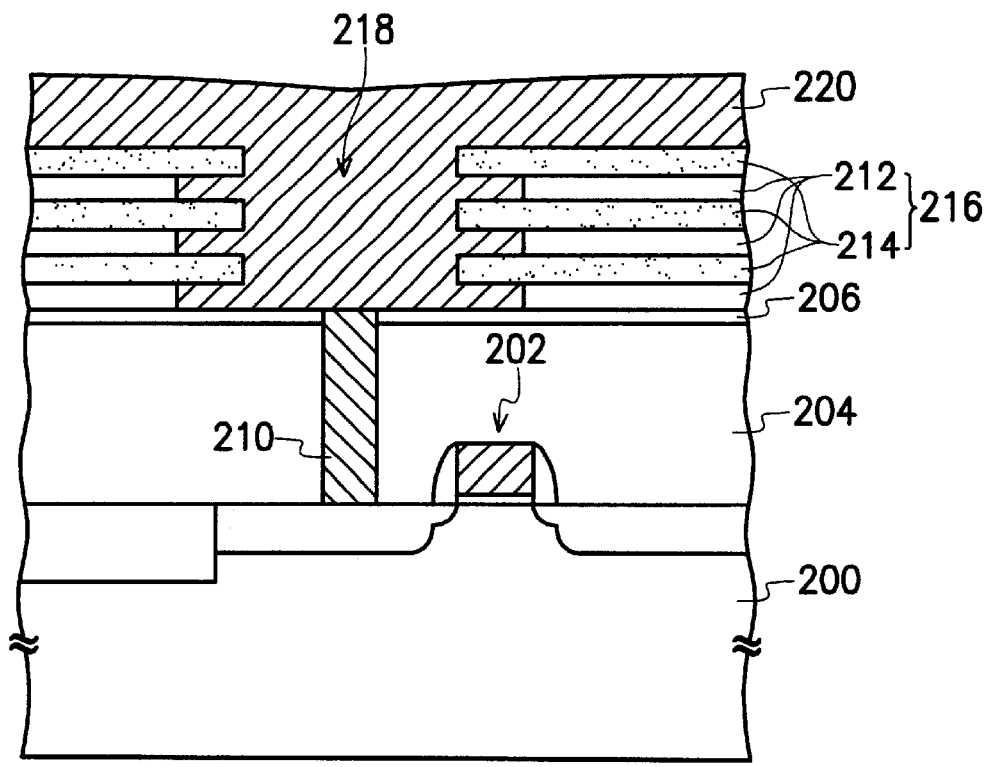

As shown in FIG. 1D, a portion of the material layers 212 is removed to form a capacitor opening 218 with serrated sidewalls. The material layers 212 can be removed, for example, by isotropic etching such as wet etching. Preferably, the etching solution is a tetrahydrofluoran (THF) solution that contains about 5% of hydrofluoric acid and 5% of water. Using the etching solution, etching selectivity between borophosphosilicate glass and high temperature oxide can be as big as 100.

A polysilicon layer 220 is next formed over the substrate 200 and filling the capacitor opening 218. Preferably, the polysilicon layer 220 is undoped. The polysilicon layer 220 is formed, for example, by chemical vapor deposition carried out at a reacting temperature of about 620° C. and a pressure of about 0.2 Torr and using silane as the reactive gas. Since the polysilicon layer 220 is formed by chemical vapor deposition, the polysilicon layer 220 has excellent step coverage and hence capable of completely filling the serrated sidewalls of the capacitor opening 218.

Figure 1E:
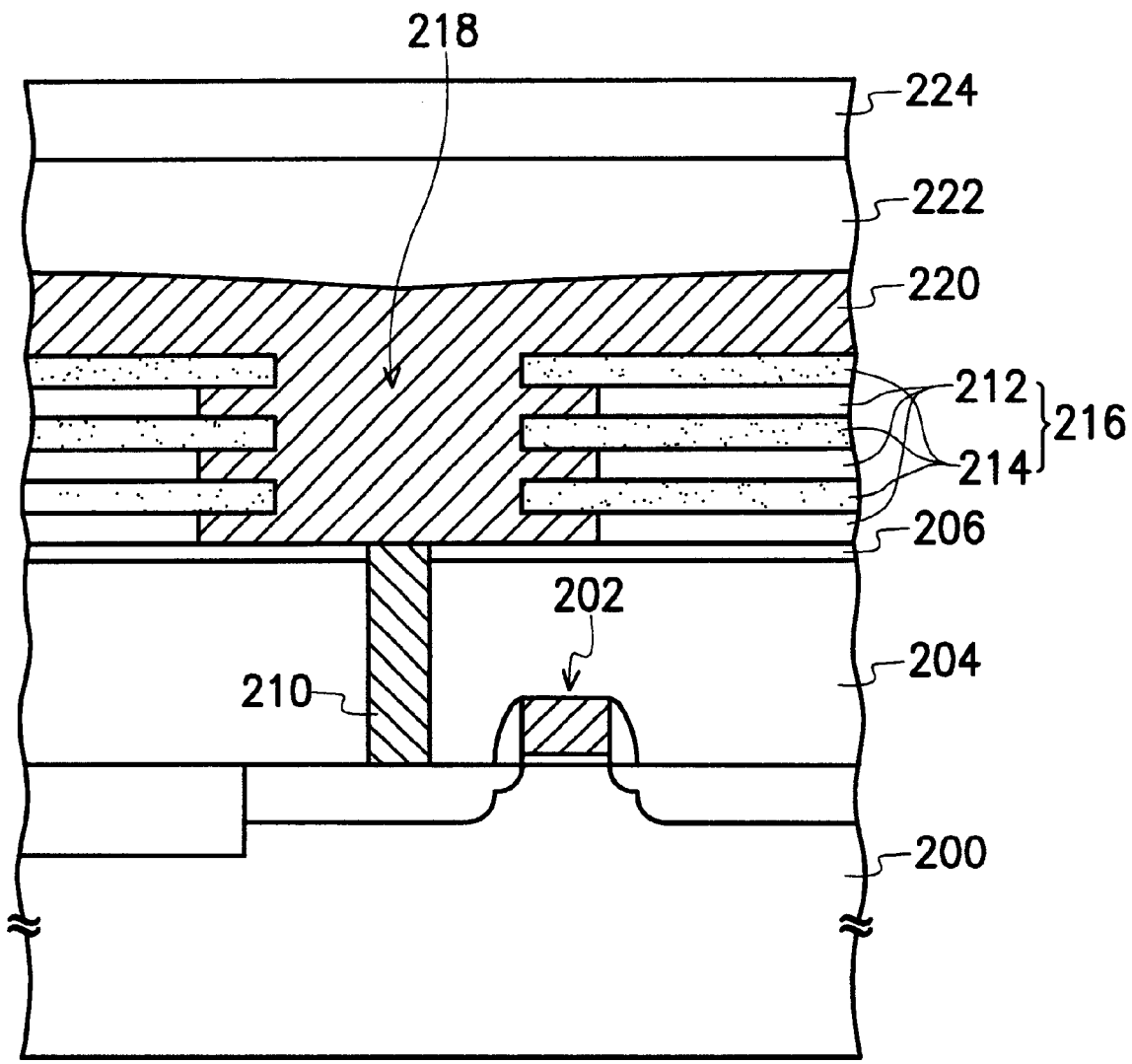

As shown in FIG. 1E, an aluminum layer 222 is formed over the substrate 200 and the polysilicon layer 220. A metallic layer 224 is formed over the aluminum layer 222. The aluminum layer 222 is formed, for example, by physical vapor deposition. The metallic layer 224 is preferably a titanium layer.

Figure 1F:
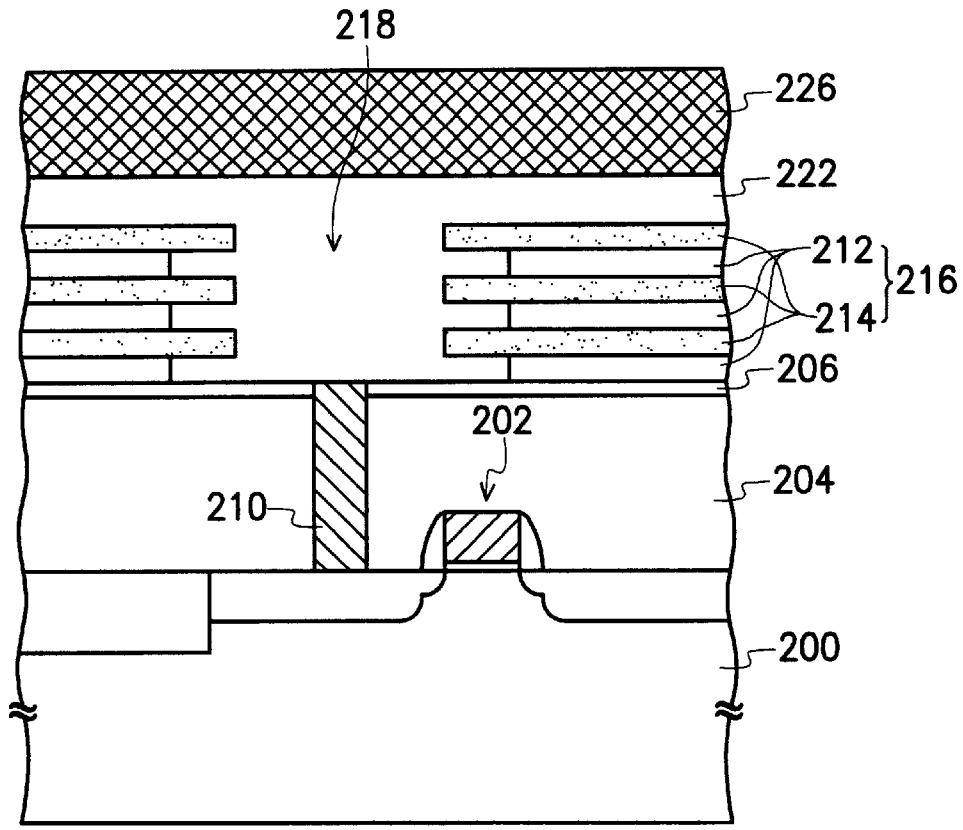

As shown in FIG. 1F, an annealing operation is carried out so that the aluminum atoms in the aluminum layer 222 can replace the silicon atoms in the polysilicon layer 220. Gradually, the capacitor opening 218 is filled by aluminum. The displaced silicon atoms react with the metal atoms in the metallic layer 224 to form a metal silicide layer 226 above the aluminum layer 222. The annealing step is preferably carried out at a temperature between 450 to 500° C. in the presence of nitrogen.

Figure 1G:
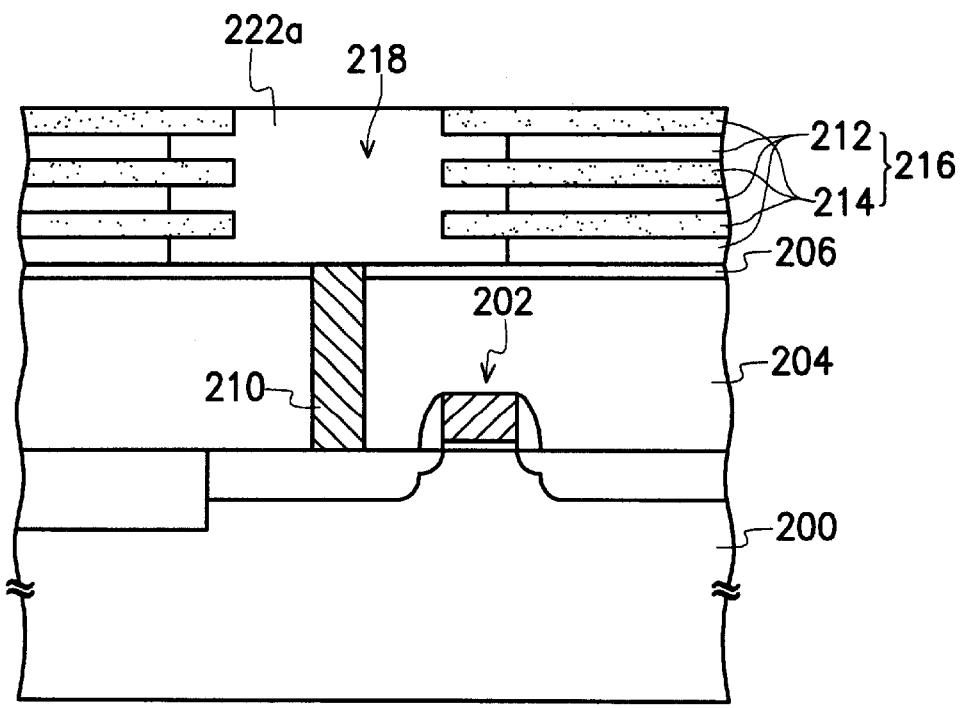

As shown in FIG. 1G, a chemical-mechanical polishing is conducted so that the metal silicide layer 226 and the aluminum layer 222 above the stack layer 216 are removed in sequence. Ultimately, an aluminum layer 222a is retained inside the capacitor opening 218.

Figure 1H:
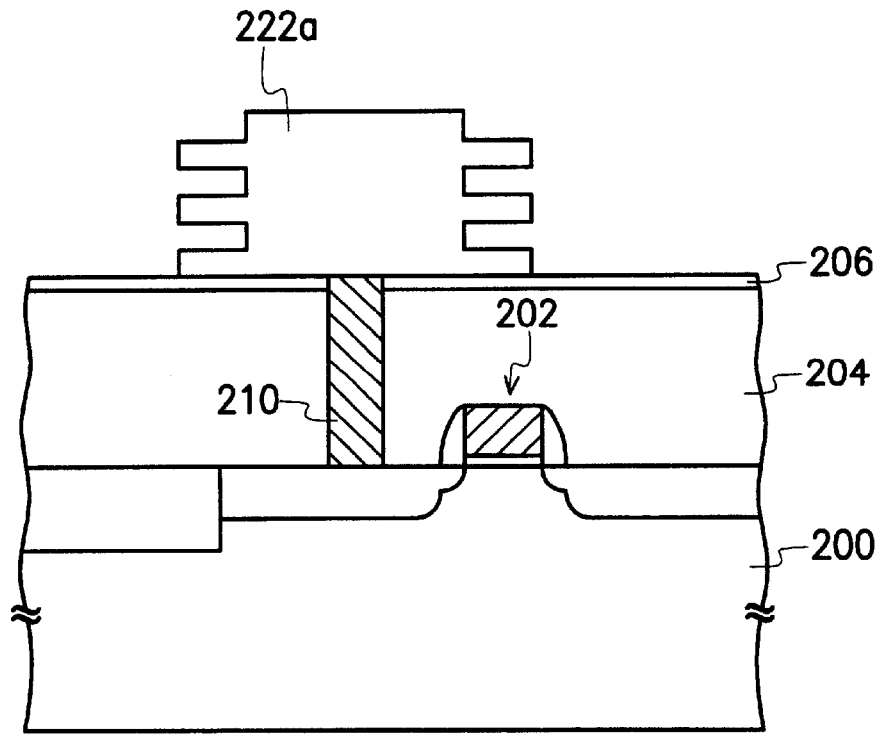

As shown in FIG. 1H, the stack layer 216 is removed to expose the aluminum layer 222a, thereby forming the lower electrode of a capacitor. The stack layer 216 can be removed, for example, by chemical dry etching (CDE).

Figure 1I:
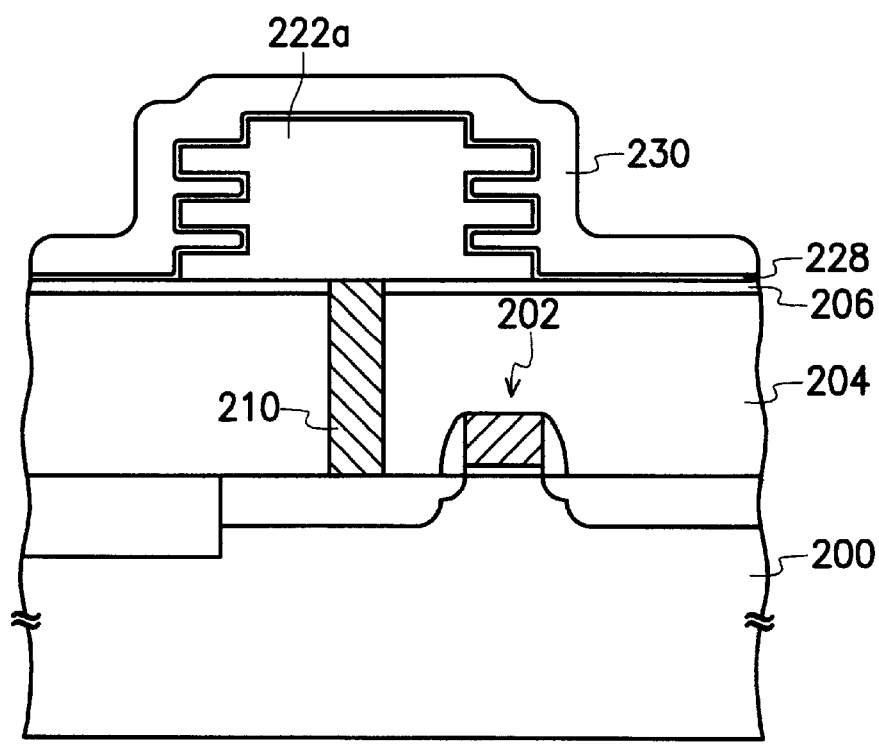

As shown in FIG. 1I, a capacitor dielectric layer 228 is formed over the lower electrode 222a and then a conductive layer 230 is formed over the capacitor dielectric layer 228 serving as an upper electrode. The capacitor dielectric layer 228 can be a barium-strontium-titanate (BaSrTiO$_3$, BST) layer or a Al$_2$O$_3$ layerformed, for example, by chemical vapor deposition. The conductive layer 230 can be a titanium nitride layer or a ruthenium layer formed, for example, by chemical vapor deposition.

In this invention, aluminum instead of polysilicon is used to fabricate the lower electrode. Hence, problems caused by the formation of a capacitor depletion region can be prevented.

Furthermore, in the fabrication of the aluminum lower electrode, polysilicon, which has good step coverage, is deposited into the mold inside the stacked layer first. The polysilicon layer inside the mold is subsequently replaced by aluminum deposited over the polysilicon layer in a polysilicon-aluminum displacement process.

The stacked layer is made from two different insulating materials that has different etching rates. Hence, a capacitor opening with serrated sidewalls can be easily formed in the stacked layer by etching. Utilizing the mold cavity with serrated sidewalls, a fin-shaped aluminum lower electrode that can increase overall surface area of the lower electrode is formed with ease.

In addition, the aluminum lower electrode is formed by displacing polysilicon instead of depositing directly into the mold cavity in the stacked layer. Therefore, aluminum is first deposited over the polysilicon layer by physical vapor deposition. Later, the aluminum lower electrode layer displaces the underlying polysilicon layer. Because the aluminum lower electrode layer is formed by displacement, step coverage problems encountered by a conventional metal deposition process can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing dynamic random access memory capacitor, comprising the steps of:

providing a substrate;

forming a dielectric layer over the substrate;

forming a stopping layer over the dielectric layer;

forming a contact plug through the dielectric layer and the stopping layer;

forming a stacked layer over the substrate, wherein the stacked layer comprises of a plurality of first material layers and a plurality of second material layers alternating with each other;

patterning the stacked layer to form a capacitor opening in the stacked layer;

removing a portion of the first material layers to form serrated sidewalls on the capacitor opening;

forming a polysilicon layer over the substrate and filling the capacitor opening;

forming an aluminum layer over the polysilicon layer;

forming a metallic layer over the aluminum layer;

performing an annealing operation so that the aluminum layer displaces the polysilicon layer and fills the capacitor opening and the polysilicon atoms in the displaced polysilicon layer react with the metal atoms in the metallic layer to form a metal silicide layer;

removing the aluminum layer and the metal silicide layer above the stacked layer;

removing the stacked layer to expose the aluminum layer, wherein the exposed aluminum layer serves as the lower electrode of the capacitor;

forming a dielectric layer over the lower electrode; and forming a conductive layer over the dielectric layer, wherein the conductive layer serves as the upper electrode of the capacitor.

2. The method of claim 1, wherein the first material layers and the second material layers have different etching rates.

3. The method of claim 2, wherein material forming the first material layers includes borophosphosilicate glass and material forming the second material layers includes high temperature oxide.

4. The method of claim 1, wherein the step of removing a portion of the first material layers includes wet etching.

5. The method of claim 4, wherein the first material layers are etched using a tetrahydrofluoran solution with 5% hydrofluoric acid and 5% water.

6. The method of claim 1, wherein the step of forming the polysilicon layer includes reacting at a temperature of about 620° C. in a reaction chamber having a pressure of about 0.2 Torr and using silane as the reactive gas.

7. The method of claim 1, wherein the step of forming the metallic layer includes depositing titanium.

8. The method of claim 1, wherein the step of performing an annealing operation includes heating to a temperature between about 450 to 500° C.

9. The method of claim 1, wherein the annealing step is conducted in a nitrogen-containing atmosphere.

10. The method of claim 1, wherein the step of removing the aluminum layer and the metal silicide layer above the stacked layer includes conducting a chemical-mechanical polishing operation.

11. The method of claim 1, wherein the step of removing the stacked layer includes chemical dry etching.

12. The method of claim 1, wherein the dielectric layer includes a barium-strontium-titanate layer.

13. The method of claim 1, wherein the dielectric layer includes a $Al_2O_3$ layer.

14. The method of claim 1, wherein material forming the conductive layer includes titanium nitride.

15. The method of claim 1, wherein material forming the conductive layer includes a ruthenium layer.

16. A method of manufacturing dynamic random access memory capacitor, comprising the steps of:

providing a substrate having a stacked layer thereon, wherein the stacked layer has a capacitor opening;

forming a polysilicon layer over the substrate that also fills the capacitor opening;

forming an aluminum layer over the polysilicon layer;

forming a metallic layer over the aluminum layer;

performing an annealing operation so that the aluminum layer displaces the polysilicon layer and the displaced polysilicon atoms in the polysilicon layer reacts with the metal atoms in the metallic layer to form a metal silicide layer;

removing the aluminum layer and the metal silicide layer above the stacked layer;

removing the stacked layer to expose the aluminum layer, wherein the exposed aluminum layer serves as the lower electrode of the capacitor;

forming a dielectric layer over the lower electrode; and forming a conductive layer over the dielectric layer, wherein the conductive layer serves as the upper electrode of the capacitor.

17. The method of claim 16, wherein the step of forming the polysilicon layer includes reacting at a temperature of about 620° C. in a reaction chamber having a pressure of about 0.2 Torr and using silane as the reactive gas.

18. The method of claim 16, wherein the step of forming the metallic layer includes depositing titanium.

19. The method of claim 16, wherein the step of performing an annealing operation includes heating to a temperature between about 450 to 500° C.

20. The method of claim 16, wherein the annealing step is conducted in a nitrogen-containing atmosphere.

21. The method of claim 16, wherein the step of removing the aluminum layer and the metal silicide layer above the stacked layer includes conducting a chemical-mechanical polishing operation.

22. The method of claim 16, wherein the step of removing the stacked layer includes chemical dry etching.

23. The method of claim 16, wherein the dielectric layer includes a barium-strontium-titanate layer.

24. The method of claim 16, wherein the dielectric layer includes a $Al_2O_3$ layer.

25. The method of claim 16, wherein material forming the conductive layer includes titanium nitride.

26. The method of claim 16, wherein material forming the conductive layer includes ruthenium layer.

* * * * *